US006767786B1

United States Patent
Lin et al.

(10) Patent No.: US 6,767,786 B1
(45) Date of Patent: Jul. 27, 2004

(54) METHOD FOR FORMING BOTTLE TRENCHES BY LIQUID PHASE OXIDE DEPOSITION

(75) Inventors: Shian-Jyh Lin, Chiayi Hsien (TW); Meng-Hung Chen, Taoyuan (TW); Chung-Yuan Lee, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/413,229

(22) Filed: Apr. 14, 2003

(51) Int. Cl.[7] ............................................. H01L 21/8242
(52) U.S. Cl. ..................... 438/243; 438/244; 438/637
(58) Field of Search ........................................ 438/637

(56) References Cited

U.S. PATENT DOCUMENTS 5,516,721 A * 5/1996 Galli et al. ................ 438/424
5,665,624 A * 9/1997 Hong ......................... 438/244
6,245,612 B1 * 6/2001 Chang et al. ............... 438/249
6,440,792 B1 * 8/2002 Shiao et al. ................ 438/243
2003/0045119 A1 * 3/2003 Wang et al. ................ 438/745

* cited by examiner

Primary Examiner—David Nelms
Assistant Examiner—Thao P. Le
(74) Attorney, Agent, or Firm—Quintero Law Office

(57) ABSTRACT

Method for forming bottle trenches by liquid phase oxide deposition. The method includes the steps of providing a substrate having a pad layer formed thereon, and a trench formed in a predetermined position; forming a masking layer at the bottom part of the trench; using liquid phase deposition (LPD) to form an LPD oxide layer on the sidewalls of the trench; removing the masking layer to expose the bottom part of the trench; subjecting the LPD oxide layer to annealing; and etching the bottom part of the trench not covered by the LPD oxide layer to form a bottle trench.

13 Claims, 6 Drawing Sheets

METHOD FOR FORMING BOTTLE TRENCHES BY LIQUID PHASE OXIDE DEPOSITION

BACKGROUND OF THE INVENTION

1. Field of the Invention

The present invention relates to a method for forming bottle trenches. In particular, the invention involves the formation of bottle trenches by liquid phase oxide deposition.

2. Description of the Prior Art

Generally speaking, capacitors widely used in dynamic random access memory (DRAM) are formed by two conductive layers (electrode plate) having an insulation layer between. The ability of a capacitor to store electric charges depends on the thickness of the insulation layer, surface area of the electrode plate and the electrical characteristics of the insulating material. In recent developments to reduce size of semiconductor elements to enhance integration density, memory cell area must be continuously reduced to hold a large number of memory cells, thereby increasing density. Meanwhile, the electrode plates of a capacitor in a memory cell must present sufficient surface area to store enough electric charge.

Nevertheless, since element size is continuously reducing, trench storage node capacitance of DRAM is decreasing as well. As a result, storage capacitance must be increased to maintain good operating performance for memory.

Currently, the method for increasing storage capacitance for DRAMs increases the width of the bottom of the trench, thereby increasing surface area to form a bottle-shaped capacitor. An example of the method for forming bottle trenches in Dynamic Random Access Memory (DRAM) devices is as follows. After the formation of a deep trench, sidewalls of the trench is then oxidized to form collar oxide. Nitride and poly are then deposited to cover the sidewalls and bottom of the trench. The poly layer is then oxidized, followed by forming photoresist at the bottom part of the trench. Oxide not cover by the photoresist is then removed. Next, the photoresist layer is stripped, followed by nitridation to form a nitride layer. Bottom oxide, bottom poly, top nitride and top poly are then sequentially etched. After the removal of collar oxide, a protective layer covering the top part of the trench is then formed. Bottle trench is then formed by enlarging the bottom part of the trench.

As the size of semiconductor device continues to decrease, the formation of a total number of five layers (oxide, nitride, TEOS, poly, oxide) in the trench requires much wet strip process at the bottom of the trench for follow-up striping of films. This easily creates many combined process window issues and makes the process even more difficult to control during mass production.

SUMMARY OF THE INVENTION

In order to overcome the above problems, an object of the invention is to provide an anti-collar method for forming bottle trenches by liquid phase oxide deposition, which can be adopted in 0.09 μm or even finer generation of DRAMs without the necessity for formation of multiple layers in the trench.

In order to achieve the above objects, there is provided a method for forming bottle trench, comprising providing a substrate having a pad layer formed thereon, such that a trench is formed in a predetermined position, forming a masking layer at the bottom part of the trench, using liquid phase oxide deposition to form an LPD oxide layer on the sidewalls of the trench, removing the masking layer to expose the bottom part of the trench, subjecting the LPD oxide layer to annealing, and etching the bottom part of the trench not covered by the LPD oxide layer to form a bottle trench.

According to another embodiment of the invention, the method for forming bottle trenches, comprises providing a substrate having a pad layer formed thereon, such that a trench is formed in a predetermined position, forming a protective layer on the pad layer and on the sidewalls of the trench, forming a masking layer at the bottom part of the trench, using liquid phase oxide deposition to form an LPD oxide layer on the protective layer, removing the masking layer to expose the protective layer at the bottom part of the trench, subjecting the LDP oxide layer to annealing, removing the protective layer not covered by the LPD oxide layer, and etching the bottom part of the trench not covered by the LPD oxide layer to form a bottle trench.

According to the method for forming bottle trenches by liquid phase oxide deposition of the invention, the process for forming bottle trenches is made much simpler and allows for easier process control. Consequently, the LPD oxide also helps in terms of promoting overall quality and yield of DRAM processes.

The present invention will become more fully understood from the detailed description given hereinbelow and the accompanying drawings, given by way of illustration only and thus not intended to be limitative of the present invention.

DETAILED DESCRIPTION OF THE INVENTION

$1^{st}$ Embodiment

FIGS. 1A~1E illustrate cross-sections of the process for forming bottle trenches by liquid phase oxide deposition according to one embodiment of the present invention.

Figure 1A:
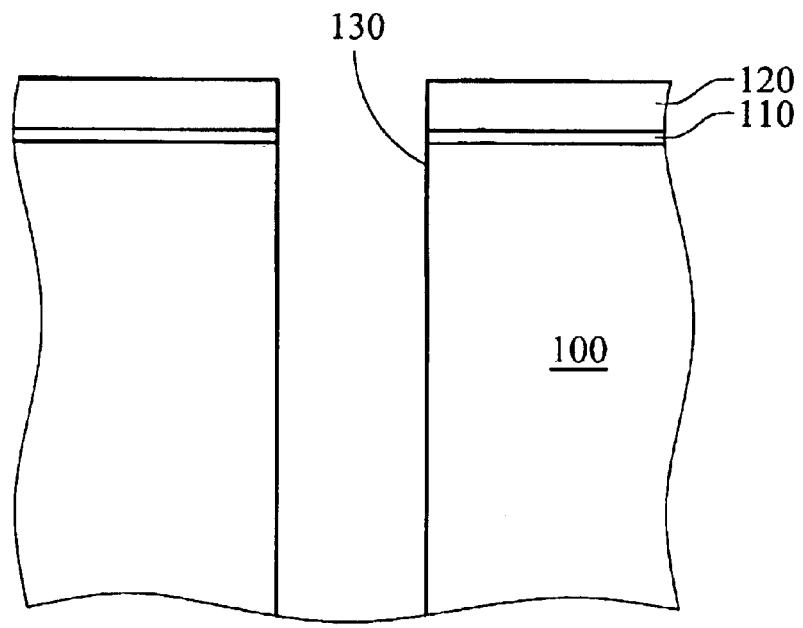
FIGS. 1A~1E illustrate cross-sections of the process for forming bottle trenches by liquid phase oxide deposition according to one embodiment of the present invention.
Figure 1B:
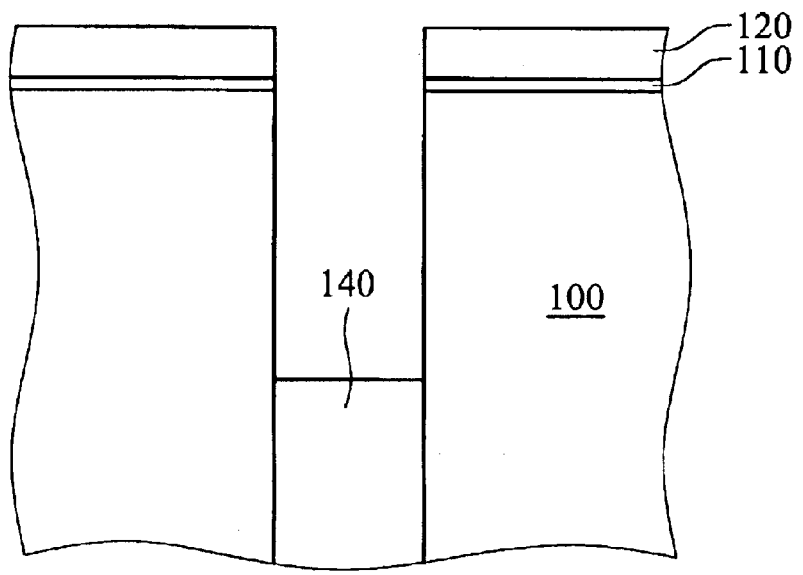

First, as shown in FIG. 1A, a substrate 100 having a pad layer comprising a stack of an oxide layer 110 and a nitride layer 120 and a trench 130, is provided.

Next, a masking layer 140 is formed in the trench. The masking layer 140 is then etched back to the level shown in FIG. 1B. The height of the masking layer defines the size of the bottle trench formed in later steps. This masking layer 140, preferably photoresist material, covers the bottom part of the trench.

Then, a LPD oxide layer 150 having a preferable thickness of 10~1000 angstroms is formed to cover the sidewalls of the trench 130 by liquid phase deposition (LPD). In this embodiment, the thickness of the LPD oxide layer is 300 angstroms. Liquid phase deposition of silicon dioxide is a simple low-temperature (usually less than 50 degrees Celsius) process for depositing $SiO_2$ thin films from a solution of hexafluorosilicic acid $H_2SiF_6$. In general form, the chemical reactions are:

$$H_2SiF_6 + 2H_2O \leftrightharpoons SiO_2 + 6HF$$

$$H_3BO_3 + 4HF \leftrightharpoons BF_4^- + H_3O^+ + 2H_2O$$

The first reaction is an equilibrium reaction, which shifts to the right as the second reaction consumes hydrofluoric acid from the solution.

Figure 1C:
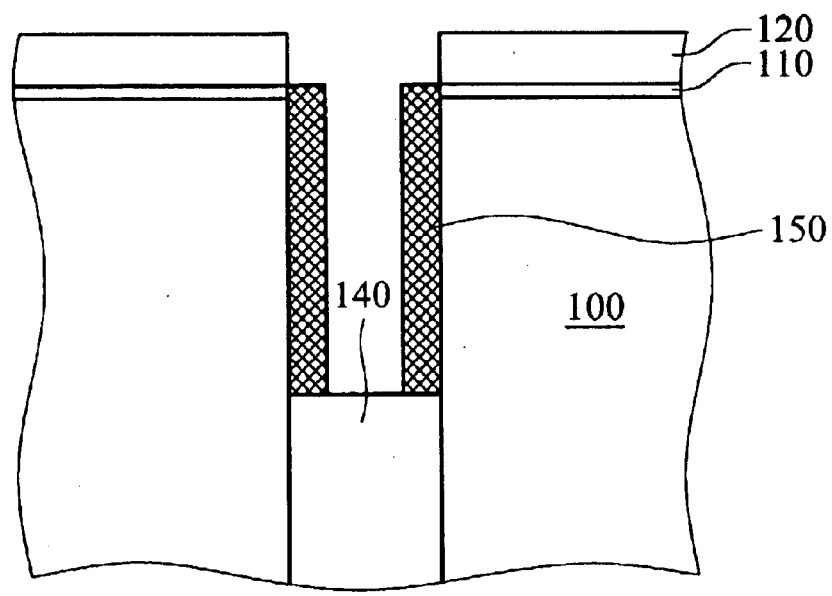

The growth of LPD oxide is selective toward photoresist and nitride, which means it does not grow on the masking layer 140 or on the nitride layer. As a result, the LPD oxide layer 150 formed only covers the sidewalls of the trench 130 but not on the masking layer 140 or the nitride layer 120, as shown in FIG. 1C.

Figure 1D:
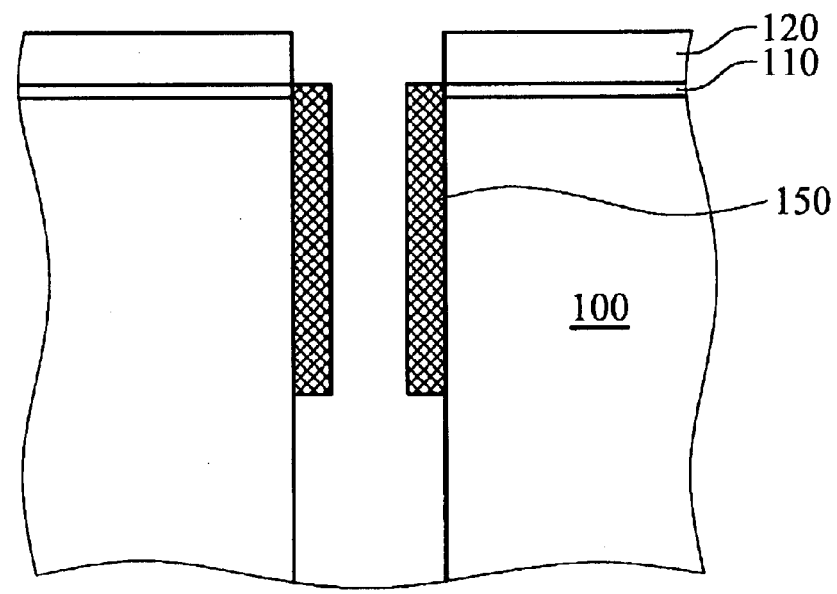

Next, the masking layer 140 of photoresist material is removed, as shown in FIG. 1D, by conventional methods such as by inorganic solution, sulfuric acid or dry ozone gas. Then, the LPD oxide layer 150 is annealed to density the oxide film, thereby increasing the selectivity of silicon etch solution to the selective oxide at later stages for forming the bottle trench.

Figure 1E:
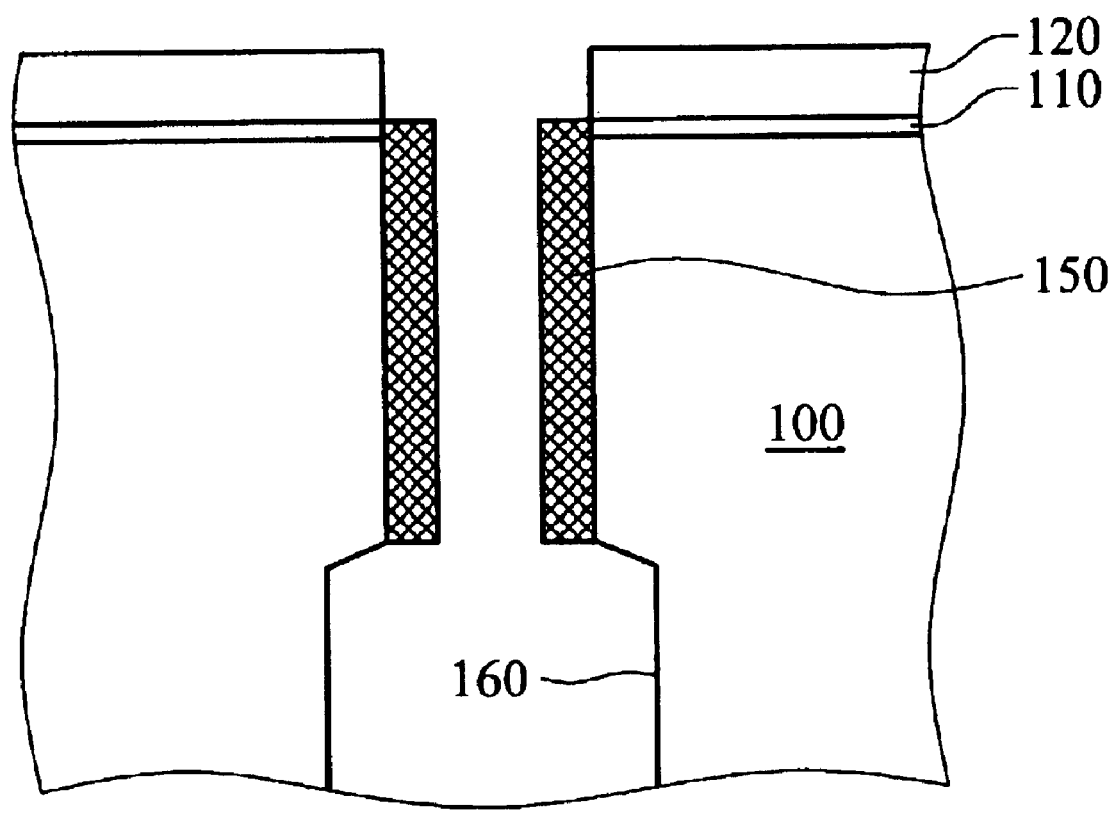

Finally, the bottom part of the trench is widened by wet etching using solution such as $NH_4OH$, $HNO_3$ or dry etching, thus forming a bottle trench 160 as shown in FIG. 1E.

$2^{nd}$ Embodiment

FIGS. 2A~2E illustrate cross-sections of the process for forming bottle trenches by liquid phase oxide deposition according to another embodiment of the present invention.

Figure 2A:
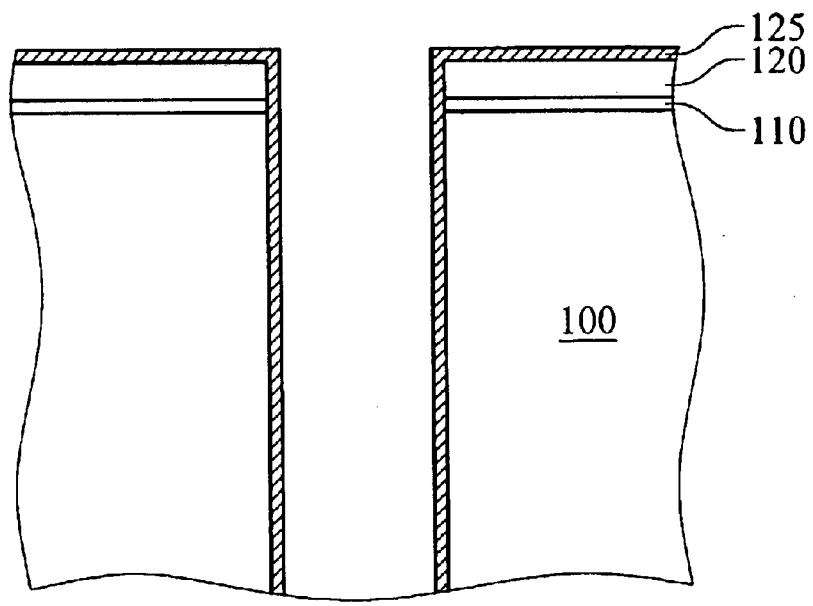
FIGS. 2A~2E illustrates the cross-section of the process for forming bottle trenches by liquid phase oxide deposition according to another embodiment of the present invention.

First, as shown in FIG. 2A, a substrate 100 having a pad layer comprising a stack of an oxide layer 110 and a nitride layer 120 and a trench 130, is provided.

Then, a protective layer 125 having thickness preferably between 50 and 100 angstroms is formed to cover the surface of the nitride layer 120 and along the sidewalls of the trench 130. The protective layer is preferably dielectric material, such as oxide.

Figure 2B:
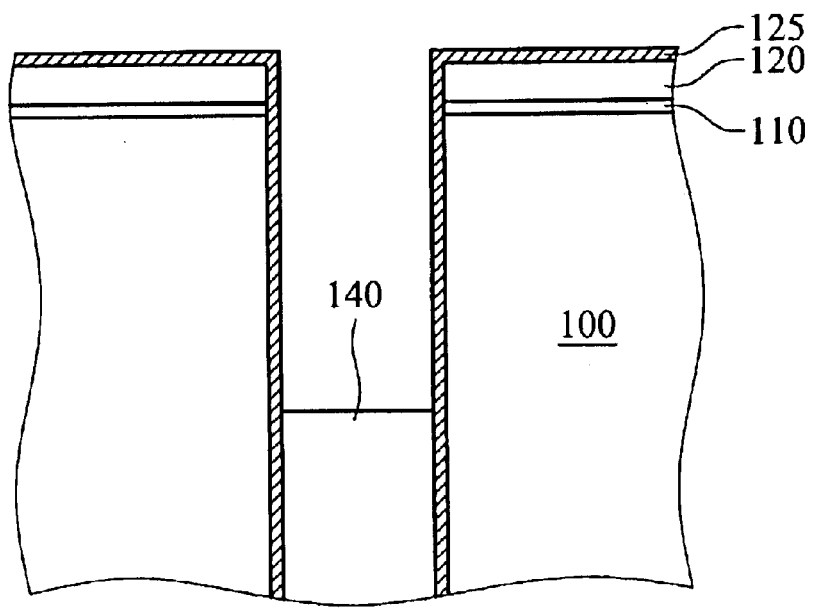

Next, a masking layer 140 is formed in the trench, as shown in FIG. 2B. The masking layer 140 is then etched back to the level shown in FIG. 2B, preferably 1.5 μm below the top of the trench. The height of the masking layer defines the size of the bottle trench formed in later steps. This masking layer 140 covers the bottom part of the trench and a protective layer is formed on the upper part of the trench. The masking layer is preferably photoresist material.

Then, a LPD oxide layer 150 is formed to cover the protective layer 125 by the same liquid phase deposition (LPD) adopted in the $1^{st}$ Embodiment. A preferable range of the LPD oxide thickness is 10~1000 angstroms. 300 angstroms is again adopted in this embodiment.

Figure 2C:
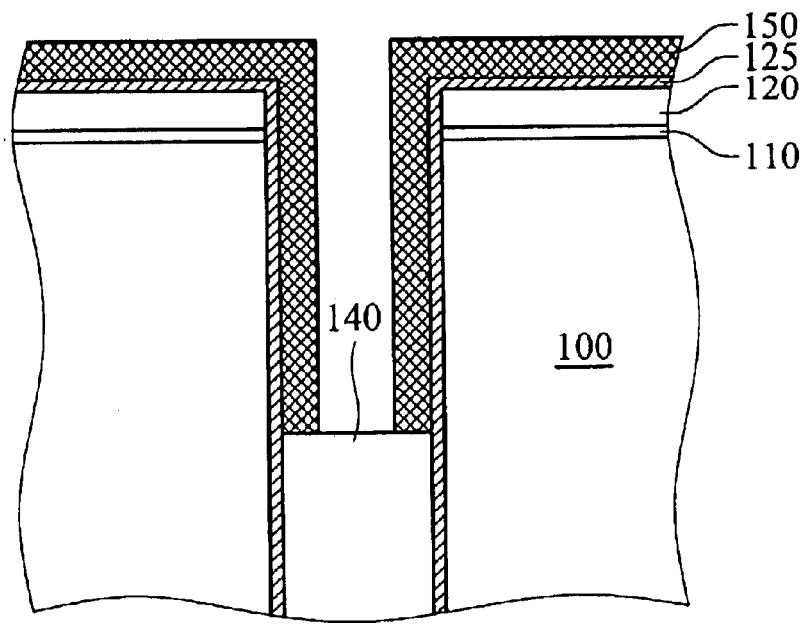

Consequently, the LPD oxide layer 150 covering the protective layer 125 but not on the masking layer 140 is formed as shown in FIG. 2C.

Figure 2D:
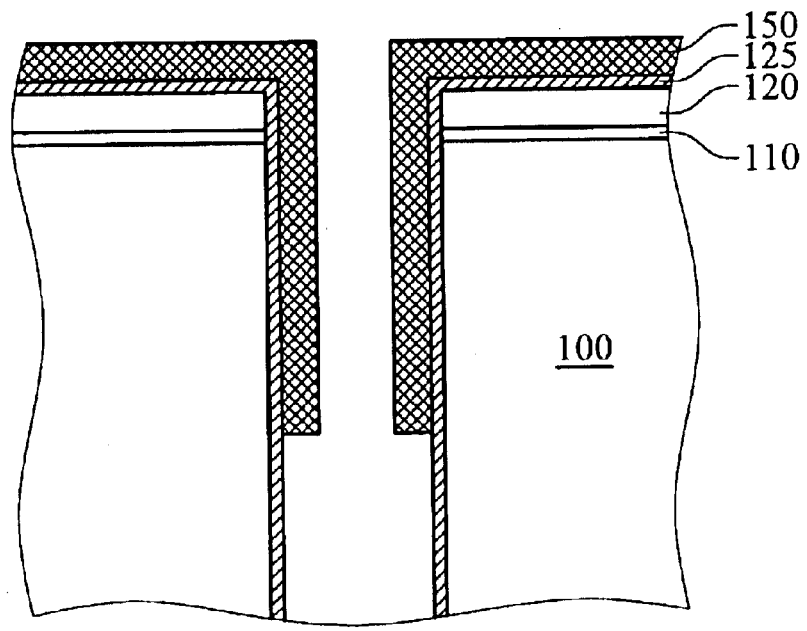

Next, the masking layer 140 of photoresist material is removed as shown in FIG. 2D by conventional methods, such as inorganic solution or sulfuric acid. Then, the LPD oxide layer 150 is annealed to densify the oxide film so that the selectivity of silicon etch solution to the selective oxide is increased for later stages of forming the bottle trench.

Next, the protective layer 125 at the bottom part of the trench not covered by the LPD oxide layer 150 is removed by wet etching. Examples of preferable solutions are diluted hydrogen fluoride (DHF) or buffered hydrogen fluoride (BHF).

Figure 2E:
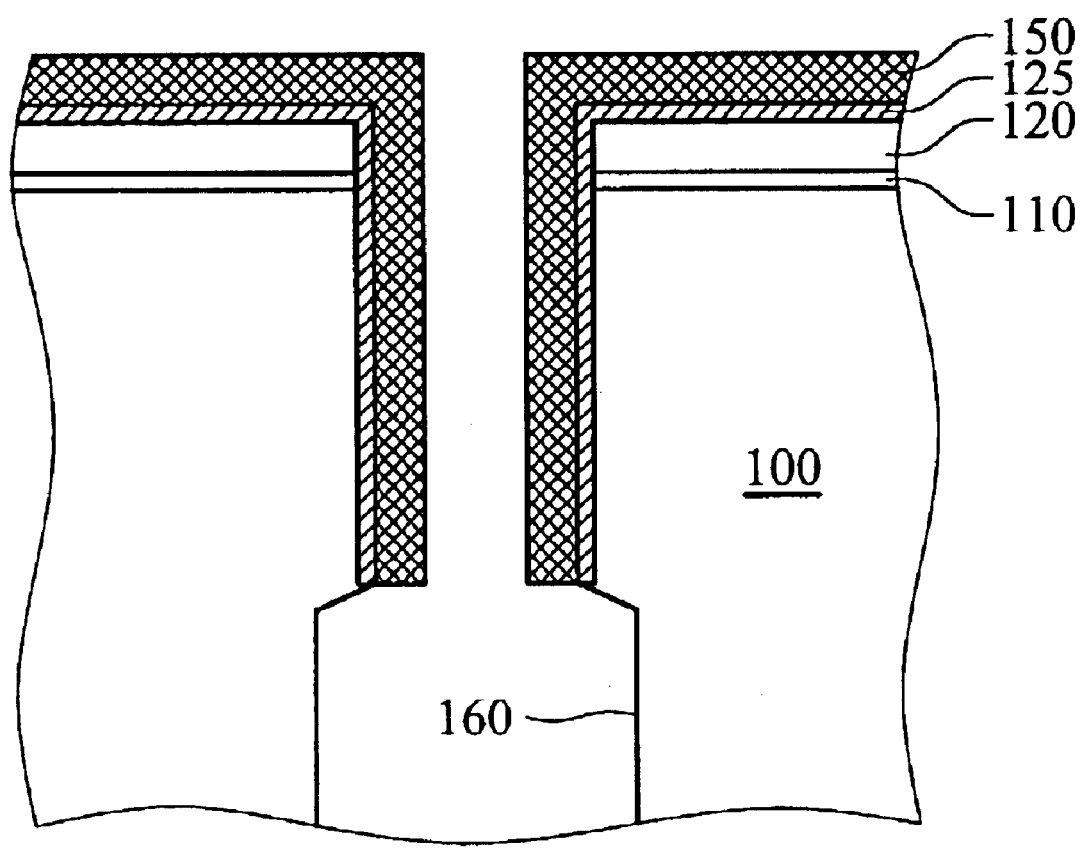

Finally, the bottom part of the trench is widened by wet etching using solution such as $NH_4OH$, $HNO_3$ or dry etching, thus forming a bottle trench 160 as shown in FIG. 2E.

According to the method provided in the invention, the formation of bottle trench by liquid phase oxide deposition allows easier process control, since fewer films are required. Therefore, the use of LPD oxide to form bottle trenches greatly improves the quality and yield of DRAM processes. Process time and costs are also reduced.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for forming bottle trenches by liquid phase oxide deposition, comprising:

providing a substrate having a pad layer formed thereon, and a trench formed in a predetermined position;

forming a masking layer at the bottom part of the trench;

using liquid phase deposition (LPD) to form an LPD oxide layer on the sidewalls of the trench;

removing the masking layer to expose the bottom part of the trench;

subjecting the LPD oxide layer to annealing; and etching the bottom part of the trench not covered by the LPD oxide layer to form a bottle trench.

2. The method as claimed in claim 1, wherein the masking layer is photoresist.

3. The method as claimed in claim 1, wherein the thickness of the LPD oxide layer is 10~1000 angstroms.

4. The method as claimed in claim 1, wherein the last etching step is carried out by $NH_4OH$, $HNO_3$ or dry etching.

5. The method claimed in claim 1, wherein the pad layer comprises a stack of an oxide layer and a nitride layer.

6. A method for forming bottle trenches by liquid phase oxide deposition, comprising:

providing a substrate having a pad layer formed thereon, and a trench formed in a predetermined position;

forming a protective layer on the pad layer and the sidewalls of the trench;

forming a masking layer at the bottom part of the trench;

using liquid phase deposition (LPD) to form an LPD oxide layer on the protective layer;

removing the masking layer to expose the bottom part of the trench;

subjecting the LPD oxide layer to annealing;

removing the protective layer not covered by the LPD oxide layer;

etching the bottom part of the trench not covered by the LPD oxide layer to form a bottle trench.

7. The method as claimed in claim 6, wherein the protective layer is dielectric material.

8. The method as claimed in claim 7, wherein the dielectric material is oxide.

9. The method as claimed in claim 6, wherein the masking layer is photoresist.

10. The method as claimed in claim 6, wherein the thickness of the LPD oxide layer is 10~1000 angstroms.

11. The method as claimed in claim 6, wherein the protective layer is removed by BHF or DHF.

12. The method as claimed in claim 6, wherein the last etching step is carried out by $NH_4OH$, $HNO_3$ or dry etching.

13. The method as claimed in claim 6, wherein the pad layer comprises a stack of an oxide layer and a nitride layer.

* * * * *